(12) United States Patent
Beccue (10) Patent No.: US 8,278,982 B2
(45) Date of Patent: Oct. 2, 2012

(54) LOW NOISE FRACTIONAL DIVIDER USING A MULTIPHASE OSCILLATOR

(75) Inventor: Stephen Mark Beccue, Thousand Oaks, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/649,315

(22) Filed: Dec. 29, 2009

(65) Prior Publication Data

US 2011/0156773 A1 Jun. 30, 2011

(51) Int. Cl.
*H03L 7/06* (2006.01)
(52) U.S. Cl. ........................ 327/156; 327/147
(58) Field of Classification Search ................. 327/147, 327/156
See application file for complete search history.

(56) References Cited

U.S. PATENT DOCUMENTS

| | | | | |
|---|---|---|---|---|
| 6,329,850 | B1 * | 12/2001 | Mair et al. | 327/107 |
| 6,456,164 | B1 * | 9/2002 | Fan | 331/16 |
| 7,042,258 | B2 * | 5/2006 | Booth et al. | 327/115 |
| 7,471,123 | B2 * | 12/2008 | Holland et al. | 327/115 |
| 7,496,168 | B2 * | 2/2009 | Leonowich et al. | 375/376 |
| 7,679,454 | B2 * | 3/2010 | Kuan et al. | 331/11 |

* cited by examiner

*Primary Examiner* — Hai L Nguyen
(74) *Attorney, Agent, or Firm* — Knobbe Martens Olson & Bear LLP (57) ABSTRACT

A frequency synthesis circuit is disclosed. The circuit includes a phase-locked loop and multi-phase oscillator such as a rotary traveling wave oscillator (RTWO). The oscillator provides a plurality of phases that are applied to a selection circuit. The selection circuit, in response to the output of a delta-sigma modulator, selects one of the phases of the multi-phase oscillator to minimize phase shift noise when the divider ratio in the loop changes, thereby eliminating a source of noise that contaminates the synthesized frequency. This permits the use of the frequency synthesis in applications requiring a high degree of spectral purity.

20 Claims, 6 Drawing Sheets

LOW NOISE FRACTIONAL DIVIDER USING A MULTIPHASE OSCILLATOR

CROSS-REFERENCE TO RELATED APPLICATIONS

Field of the Invention

The present invention relates generally to frequency synthesis and more particularly to frequency synthesis using a PLL.

DESCRIPTION OF THE RELATED ART

Wireless communications systems usually require a local oscillator to generate one or more frequencies for down-conversion of a received radio frequency signal. Ideally, the spectrum of the local oscillator is a single spectral line at the nominal frequency of the oscillator. Of course, no such oscillator exists; a real oscillator has spectral power distributed about the nominal oscillator frequency, which reduces its spectral purity compared to the ideal. This spectral power causes the introduction of oscillator noise into the down-converted signal, which seriously reduces the signal-to-noise ratio of the signal when there are large unwanted signals near the desired radio frequency signal. Therefore, it is a design goal to minimize the spectral power about the nominal frequency of the local oscillator to improve the down conversion of the received signal.

Several techniques exist for constructing an oscillator that generates a desired frequency. They include a table look-up synthesizer in which the waveform is constructed piece-by-piece from a table; a direct synthesizer, which multiplies, mixes, and divides to obtain the desired frequency; and a phase-locked loop (PLL) synthesizer, which controls a VCO to generate the desired frequency.

The table look-up and direct synthesizers have drawbacks compared to the PLL synthesizer. The table look-up synthesizer does not support high frequency operation and the direct synthesizer has a problem with spectral purity. The PLL synthesizer, on the other hand, can support high frequencies and can achieve high spectral purity. Additional advantages are it can operate at high frequency with relatively low power and can be part of an integrated circuit.

Figure 1A:
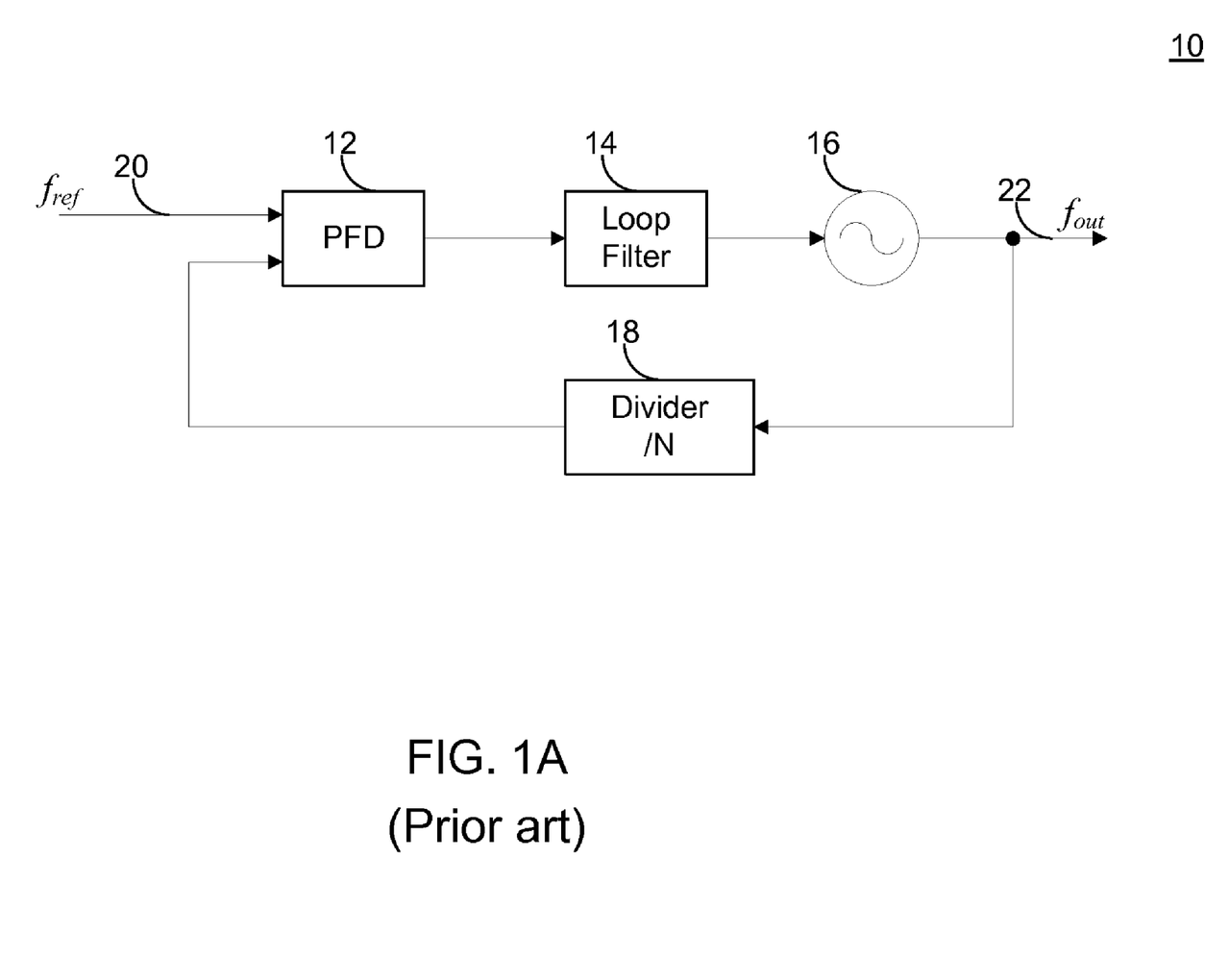
FIG. 1A shows a prior art PLL with a divider for synthesizing a frequency.

Referring to FIG. 1A, a PLL frequency synthesizer 10 has at least three components, (1) a phase/frequency detector (PFD) 12, (2) a loop filter (LF) 14, and (3) a voltage controlled oscillator (VCO) 16 arranged in a closed loop. To synthesize a variety of frequencies, usually an integer divider 18, with divider ratio N, is inserted into the loop between the VCO 16 output and the phase detector 12, as shown in FIG. 1A. This arrangement causes the loop 10 to generate a frequency 22 that is N times the reference frequency $f_{ref}$ 20 in order for the loop 10 to lock to the reference frequency 20.

One problem with the configuration of FIG. 1A is that it lacks flexibility. The configuration can only generate a frequency 22 that is an integer multiple of the reference frequency 20. Many designs, however, require an output frequency that is an integer-and-fraction multiple, N·n, (e.g., 2.5) of the reference frequency.

Figure 1B:
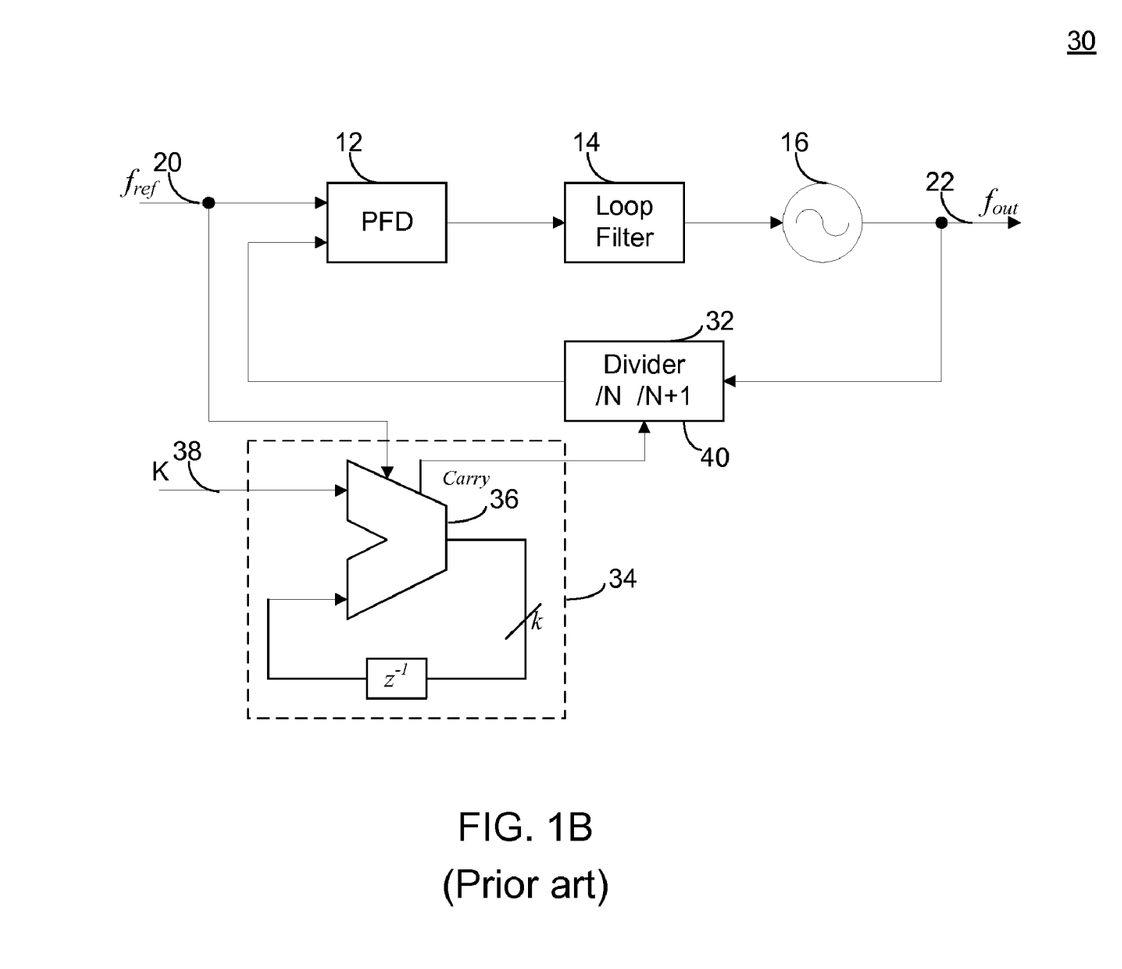
FIG. 1B shows a prior art PLL with an accumulator for synthesizing a frequency.

Fractional-N frequency synthesizers address this problem. Instead of using a divider with a single programmable integer N 18 (in FIG. 1A), they employ a divider 32, shown in FIG. 1B, that has at least two programmable integers, say N and N+1. By switching the divider ratio between N and N+1, an average fractional divide ratio between the two integers is achieved. FIG. 1B shows an implementation 30 that achieves fractional-N division. A digital modulator 34 with a constant input K 38 is added to the loop to control the switching of the divider ratio. The modulator 34 includes an accumulator 36 whose carry output alternately selects either the N or N+1 divider ratio. Thus, the frequency synthesized is $f_{ref}$·(N+n), where n is the fractional part of the divider ratio.

The synthesizer 30 of FIG. 1B operates as follows. Assume the carry output 40 is low, selecting the first divider. On each occurrence of the reference clock $f_{ref}$ 20, the accumulator 36 adds the constant input K 38 to the sum already present. When the accumulator 36 overflows, the carry bit 40 is set and the accumulated count is subtracted from the accumulator 36. The carry bit 40 now selects the second divider integer in divider 32. Thus, the first divider N is active in the loop 30 for a first period of time and the second divider N+1 is active for a second period of time, resulting in an output frequency 22 that is between the input frequency multiplied by the first divider N $f_{ref}$ and the input frequency multiplied by the second divider (N+1) $f_{ref}$. For example, suppose that the first divider N is active 75% of the time and the second divider is active 25% of the time, then the average output is 0.75N+0.25(N+1)=N·25. Thus, the time the second divider is active sets the fractional part of the divider ratio.

Continuing with the example, suppose that the reference frequency clocks an 8-bit accumulator (k=8 in FIG. 1B). It then takes a count equal to or greater than 256 to overflow the accumulator 36 and generate a carry bit 40. A constant input K 38 that achieves the desired fraction is one that keeps the carry bit 40 on for 25% of the time or, say, 1 clock of the reference clock and off for 75% of the time or 3 clocks of the reference clock $f_{ref}$. With 4 clocks corresponding to 256 counts, 1 clock corresponds to 64 counts. Thus, setting the input constant K 38 to 64, implements the N·25 divider.

More generally, if $K=n·2^k$, where n is the fractional portion of the divider ratio and k is the size in bits of the accumulator, then the frequency synthesized $$\text{is } f_{ref} \cdot \frac{(2^k - K)N + K(N+1)}{2^k}.$$

In the above example, $$f_{ref} \cdot \frac{(256-64)N + (64)(N+1)}{256} = f_{ref} \cdot (N \cdot 25).$$

Advantages of a fractional-N synthesizer circuit such as that shown in FIG. 1B are that the designer can choose the reference frequency and the loop bandwidth independently and the reference frequency can be higher. In addition, because the loop bandwidth is independent of the reference frequency, the designer can improve the locking and tracking dynamics of the PLL with a lower capacitance in the loop-filter capacitance, making the design even more amenable to integrated circuitry.

However, the fractional-N configuration still has a drawback, which is that the periodic selection of the integer N or N+1 creates noise in the synthesized frequency. At the point in time when the change from N to N+1 or from N+1 to N occurs, there is a jump in both the frequency and phase at the input to the phase detector. Because these jumps are periodic, they produce multiples of $nf_{ref}$ in the output spectrum of the PLL, despite the filtering action of the loop filter. These spikes in the spectrum are very undesirable and make this form of fractional divider unacceptable for modern communications systems.

Figure 2:
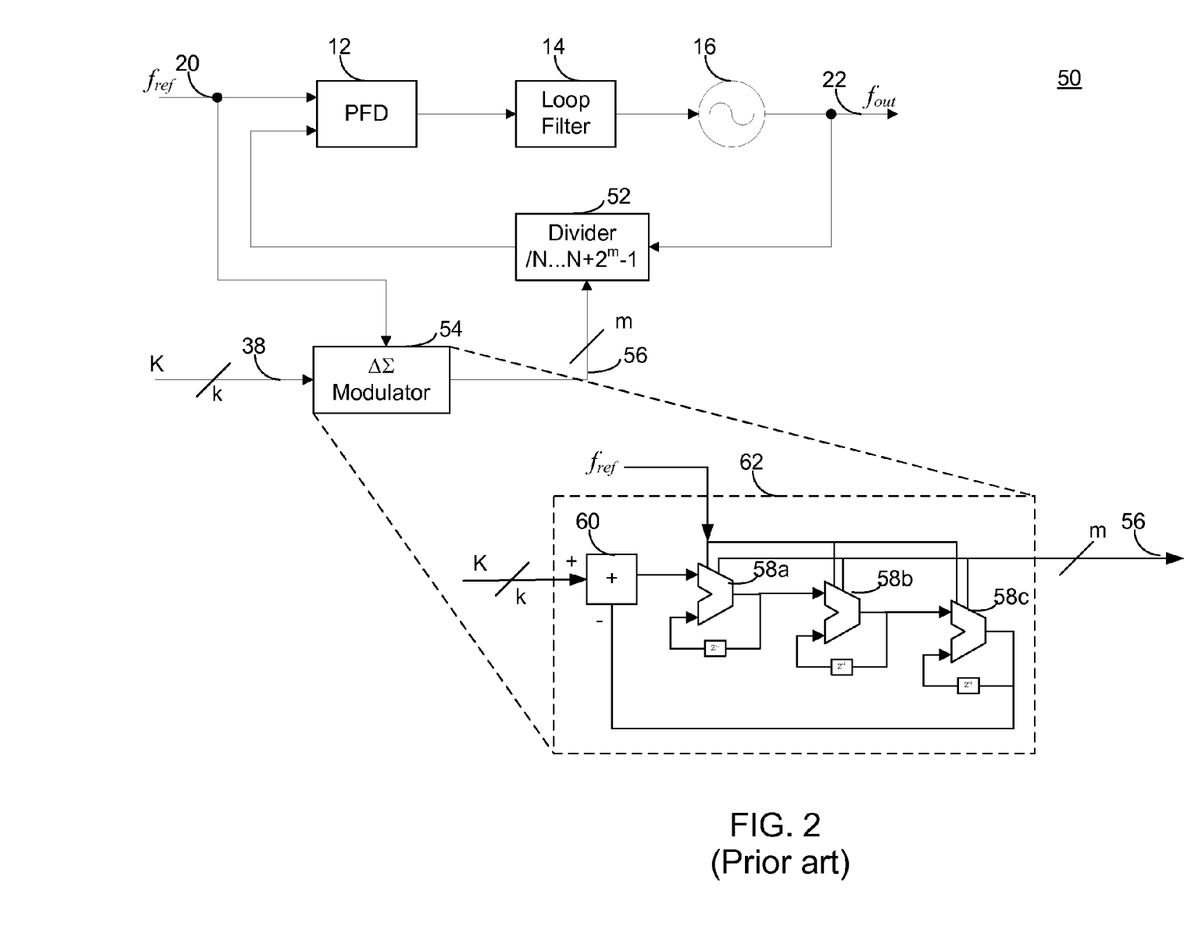
FIG. 2 shows a prior art PLL with a delta-sigma modulator for synthesizing a frequency.

The noise produced by the fractional-N configuration can be attenuated by using a delta sigma ($\Delta\Sigma$) modulator 54, as shown in FIG. 2. A $\Delta\Sigma$ modulator 54 has the ability to act as a high pass filter for the noise it produces, assuming that the modulator is oversampled. This means that modulator 54 attenuates noise closest to the signal, keeping the signal clean, but passes the higher frequency noise. The low pass filter 14 in the phase locked loop effectively handles this higher frequency noise.

One kind of $\Delta\Sigma$ modulator 54 that is very effective at shifting the noise to the higher frequencies is an N-bit modulator 62, which can have a noise transfer function (NTF) that is of order N, i.e., $N(z) \propto (1-z^{-1})^N$, indicating that it acts as an Nth order high pass filter for frequencies near the signal. When an N-bit modulator 62 (which includes accumulators 58$a$-$c$ and adder 60) is used, as shown in FIG. 2, the multiple output bits 56 select many different values of the divider 52. A $3^{rd}$-order modulator 62, such as shown in the inset of FIG. 2, for example, would employ 8 values of N, {N–3, N–2, N 1, N, N+1, N+2, N+3, N+4}, to realize some divider N·n. Note that, in general, the number of divider states is $2^O$, where O is the order of the modulator.

BRIEF SUMMARY OF THE INVENTION

One embodiment of the present invention is a frequency synthesizer circuit. The circuit includes a multi-phase oscillator, a loop filter, a multi-phase oscillator control circuit, a selecting means, a dividing means, a synchronizer, a phase-frequency detector (PFD), and a delta sigma modulator. The multi-phase oscillator oscillates at a controllable frequency and provides a plurality of phases each at the controllable frequency. The loop filter filters an input to control the controllable frequency of the multi-phase oscillator. The multi-phase oscillator control circuit receives an output of the loop filter to control the frequency of the multi-phase oscillator. The selecting means selects one of the plurality of phases of the multi-phase oscillator by decoding a multibit control signal into a plurality of decoded signals, wherein each of the decoded signals is operable to select one of the phases. The dividing means divides the controllable frequency of the multi-phase oscillator by either N or N+1, according to a divider control signal value. The synchronizer synchronizes an output of the dividing means with the selected phase of the multi-phase oscillator. The phase-frequency detector compares an external reference frequency signal with the synchronizer output to determine a difference in frequency or phase, the difference being applied to the input of the loop filter. The delta-sigma modulator receives a constant digital input signal and the external reference frequency to provide, in response, the multi-bit control signal and the divider control signal.

One advantage of the present invention is that the output frequency is has greater spectral purity making the invention useful in a greater variety of applications.

Another advantage is that the present invention is amenable to integrated circuit fabrication because it uses digital circuitry to select the phases of the multi-phase oscillator.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 3A:
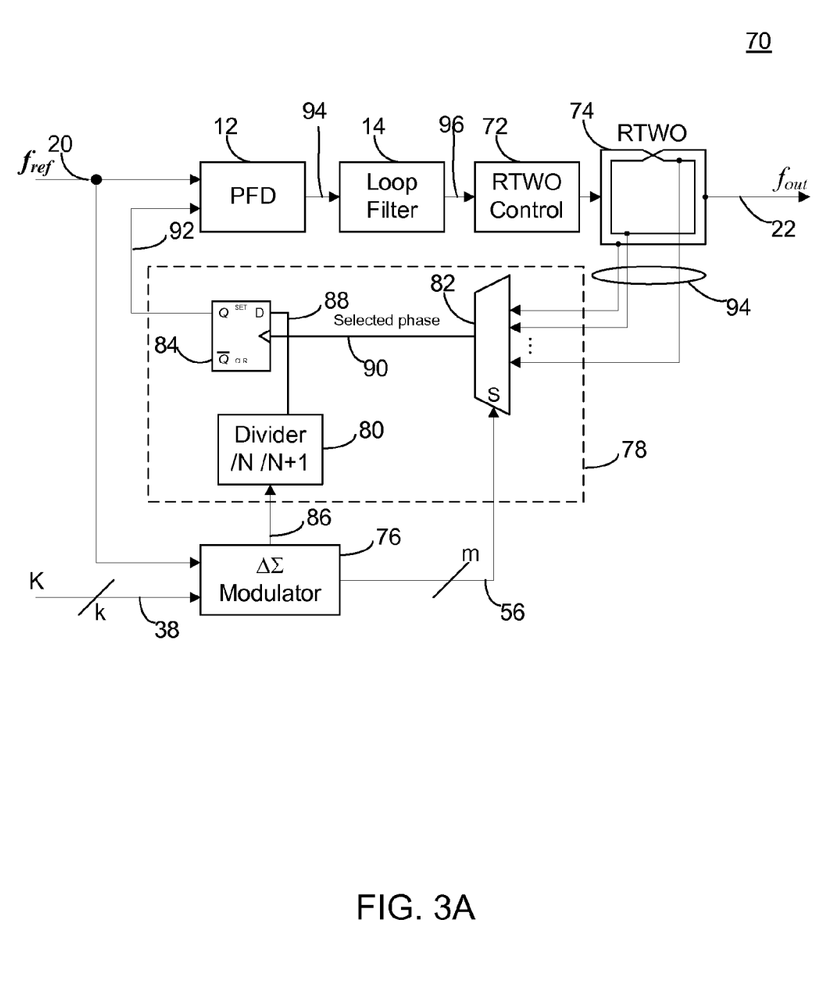
FIG. 3A shows an embodiment of the present invention

Even though a higher order $\Delta\Sigma$ modulator addresses one source of the noise, i.e., the frequency shift generated by the shifts in the divider ratio, another source of noise remains, which is the phase shift that accompanies the shift in divider ratios. The present invention addresses this source of noise. By utilizing the many phases available from a multi-phase oscillator such as a rotary traveling wave oscillator (RTWO), the present invention dramatically reduces the noise generated in a fractional-N synthesizer. (A rotary traveling wave oscillator is disclosed in U.S. Pat. No. 6,556,089, which is incorporated by reference in its entirety into this application.) Using only two divider ratios N and N+1, a multibit $\Delta\Sigma$ modulator output selects one of the many available phases of the RTWO for input to a synchronizer whose output drives the PFD. FIG. 3A shows this arrangement. For an order O modulator, the noise improvement is $20 \cdot \log_{10}(2^O)$. In a $3^{rd}$-order modulator, the noise improvement is $20 \log_{10}(8) \approx 18$ dB and in a fourth-order $\Delta\Sigma$ modulator, which selects 16 phases of the RTWO, the noise improvement is $20 \cdot \log_{10}(16) \approx 24$ dB.

One version of the invention shown in FIG. 3A includes a $\Delta\Sigma$ modulator 76, a divider 80 with only two selectable integers, N and N+1, a phase selector 82, a synchronizing element 84 (shown as a flip-flop), a phase-frequency detector 12 (PFD), a loop filter 14, a control circuit 72 for the RTWO, and a multi-phase oscillator such as an RTWO 74. The $\Delta\Sigma$ modulator 76 receives a constant input integer K 38 and the reference frequency $f_{ref}$ 20 and provides (i) a phase selection output 56 to the phase selector 82 to select a phase from the RTWO 74 and (ii) an output 86 that selects the integer for the divider 80. The divider 80 receives the divider selection output 86 from the $\Delta\Sigma$ modulator 76 and provides an output 88 to the synchronizing element/synchronizer 84. The synchronizing element/synchronizer 84 receives as clock a selected phase 90 from the phase selector 82, and as data input the output 88 of the divider 80, and provides an output 92 to the PFD 12. The phase selector 82 receives a plurality of phases 94 from the RTWO 74 and the phase selection input 56 from the $\Delta\Sigma$ modulator 76 and provides a selected phase output 90 to the synchronizing element/synchronizer 84. The PFD 12 receives the output 92 from the synchronizing element/synchronizer 84 and the reference frequency 20 and provides a comparison output 94 to the loop filter 14. The loop filter 14 performs a low pass filtering function on the comparison output 94 and provides the filtered output 96 to the RTWO control circuit 72. The RTWO control circuit 72 controls the frequency and phase of the RTWO 74, which provides the plurality of phases 94 to the phase selector 82. The RTWO control circuit 72 can be implemented with varactors, switched capacitors, or a selection of a fast/slow amplifiers attached to the RTWO 74. The actual control signals can be analog or digital or both.

In operation, the constant input K 38 sets the fractional portion of the divider 80 in the feedback loop. At each occurrence of the reference frequency 20, the modulator 76 is updated. If the modulator update does not change the integer selection (N or N+1) in the divider 80, then no change at the PFD 12 occurs and the loop stays locked at the current frequency and phase. However, when an update to the modulator 76 causes a change in the integer selection in the divider 80, a change in the D-input of the synchronizer 84 does occur. This change does not propagate to the PFD 12 until the phase selected 90 by the phase selector 82 clocks the synchronizer 84. At that instant, the input 92 to the PFD 12 changes, reflecting the new frequency and phase to which the loop should lock. After locking, the loop continues to operate at the new frequency and phase until the update to the modulator 76 again changes the integer selection in the divider 80, at which instant the loop now begins locking to a new frequency and phase selected by the modulator 76. By selecting not only the new frequency but also a phase that is reflective of the count 56 in the modulator 76, the circuit significantly reduces the phase noise and improves spectral purity in the synthesized frequency. Compared to the prior art in which one or more VCO cycles constitute the new frequency sent to the PFD, the present invention introduces a small change in phase, which lowers the noise compared to the prior art.

Figure 3B:
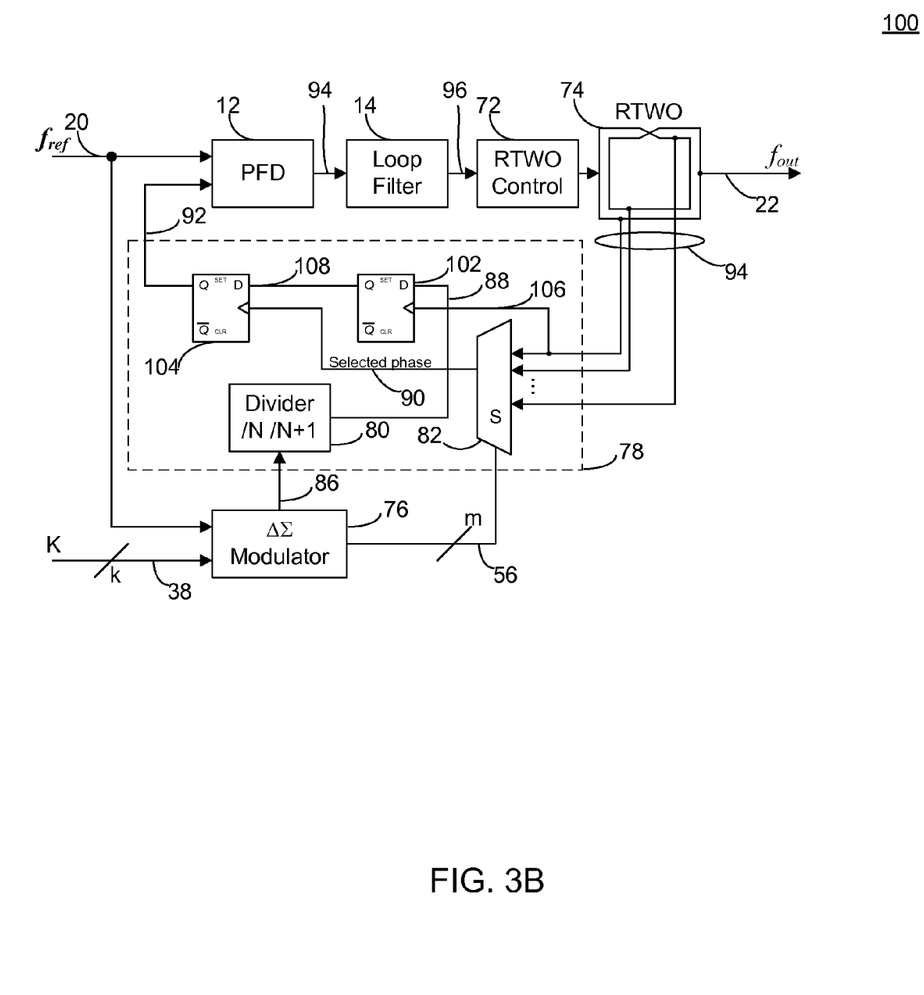
FIG. 3B shows another embodiment of the present invention.

FIG. 3B shows another embodiment of the present invention. In this embodiment, the RTWO 74 provides one of its phases 106 as a synchronization signal to a first synchronizer 102, which synchronizes the output of the divider 80. The phase selector 82 provides a selected phase 90 to the clock input of a second synchronizer 104, which receives the Q output of the first synchronizer 102. The second synchronizer 104 provides a properly divided and phased output 110 to the PFD 12, which compares it to the reference clock 20. Again, in this embodiment, the loop locks to the frequency output of the divider and the selected phase 90 from the RTWO 74.

Figure 4:
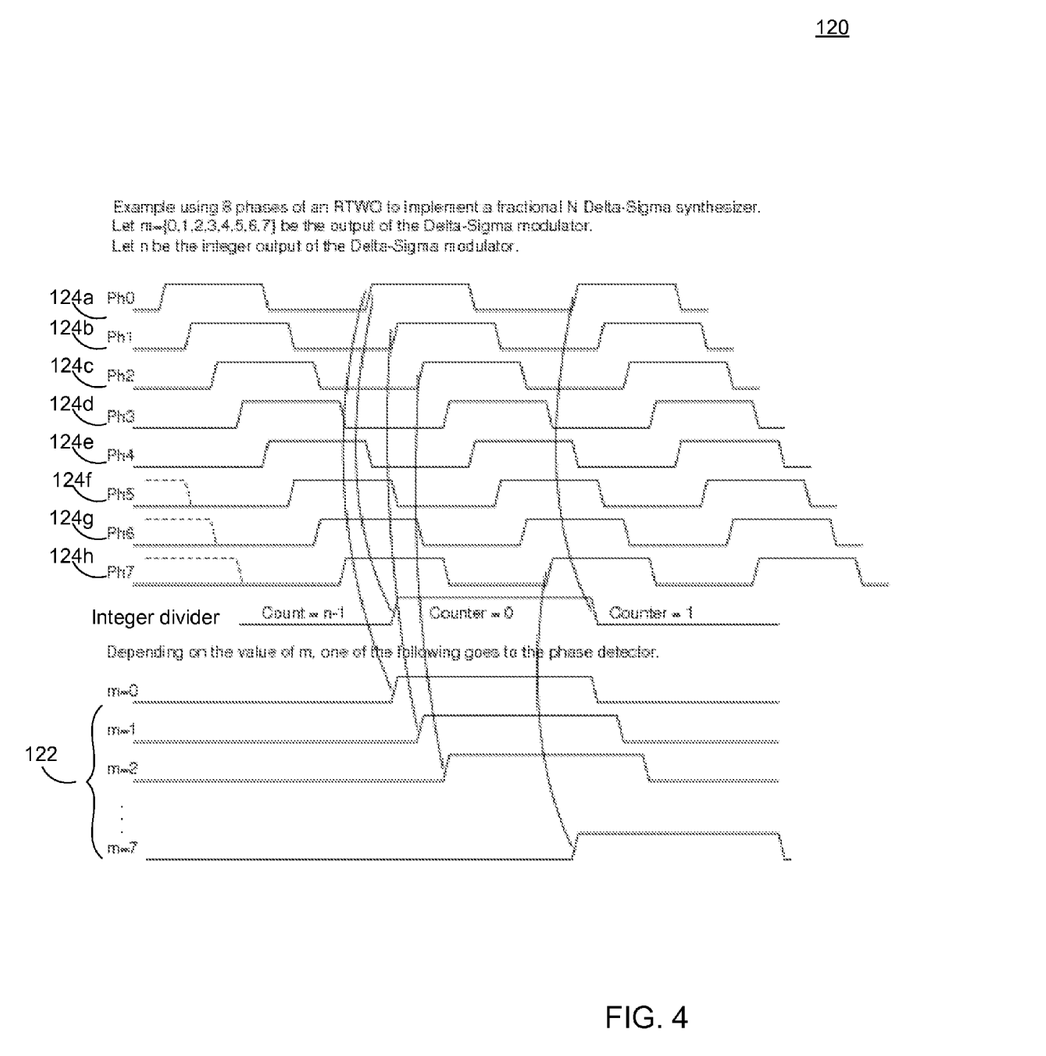
FIG. 4 shows a timing diagram for the operation of the synthesizer of FIGS. 3A and 3B.

FIG. 4 shows a timing diagram 120 in accordance with the embodiments of the present invention. In the figure, there are eight output values m=0.7 122 provided by the modulator 76. These eight output values 122 select corresponding phases of the RTWO 74. In particular, if the output m of the modulator is 0, the ph0 124a of the RTWO 74 is selected for the PFD 12 and if the output m of the modulator is 7, then ph7 124h of the RTWO 74 is selected for phase comparison. The divider ratio N or N+1 is selected based on the carry output of the ΔΣ modulator 76, as before.

The present invention with a $3^{rd}$ order ΔΣ modulator can achieve a noise reduction of about 18.06 dB. A $4^{th}$ order modulator and a 16 phase-RTWO can reduce the noise by about 24.08 dB. This is a 6 dB improvement over the third order ΔΣ modulator and is consistent with the noise reduction equation.

If there is noise induced by the phase mismatch (due to process variation) of the selected phases, several techniques are available for reducing the phase mismatch noise. These techniques include (a) sizing devices such that the 1-sigma mismatch equals or exceeds the requirement, (b) trimming the individual RTWO phases, or (c) trimming the individual multiplexer elements.

A multi-phase oscillator such as an RTWO is especially suited to this invention because the phase delays of the RTWO are proportional to the frequency, unlike a tapped delay line whose taps do not scale correctly with frequency.

Although the present invention has been described in considerable detail with reference to certain preferred versions thereof, other versions are possible. Therefore, the spirit and scope of the appended claims should not be limited to the description of the preferred versions contained herein.

What is claimed is:

1. A method of frequency synthesis, the method comprising:
    generating a plurality of phase signals using a multi-phase oscillator, wherein the plurality of phase signals oscillate at a controllable frequency and vary in phase from one another;
    selecting one of the plurality of phase signals at a time to generate a selected phase signal;
    dividing the selected phase signal by an integer divisor; and
    using a delta-sigma modulator to repeatedly change the integer divisor such that a fractional divide ratio is synthesized and to repeatedly control reselection of the selected phase signal such that phase noise associated with changes to the integer divisor is reduced.

2. The method of claim 1, further comprising generating a synchronized output by synchronizing the divider output to a reference frequency.

3. The method of claim 2, further comprising reselecting the selected phase signal and changing the integer divider in response to changes of the reference frequency.

4. The method of claim 2, further comprising generating a detector output by comparing the synchronized output to the reference frequency using a phase detector.

5. The method of claim 4, further comprising changing the controllable frequency of the plurality of phase signals based at least partly on the detector output.

6. The method of claim 1, wherein the multi-phase oscillator comprises a rotary travelling wave oscillator (RTWO).

7. The method of claim 1, wherein repeatedly changing the integer divisor comprises repeatedly changing the programmable integer divisor back and forth between a value of N and a value of N+1.

8. An apparatus comprising:
    a multi-phase oscillator configured to oscillate at a controllable frequency and to generate a plurality of phase signals oscillating at the controllable frequency;
    a phase selector configured to receive the plurality of phase signals and a phase select control signal, wherein the phase selector is configured to generate a selected phase signal by selecting one of the plurality of phase signals corresponding to a state of the phase select control signal;
    a divider configured to divide the selected phase signal by a programmable integer divisor to generate a divider output; and
    a delta-sigma modulator configured to generate the phase select control signal and to repeatedly change the programmable integer divisor to synthesize a fractional divide ratio.

9. The apparatus of claim 8, wherein the delta-sigma modulator is further configured to generate the phase select control signal so as to reduce a phase noise associated with changes of the programmable integer divisor.

10. The apparatus of claim 9, further comprising a synchronizer configured to generate a synchronized output by synchronizing the divider output to a reference frequency.

11. The apparatus of claim 10, wherein the delta-sigma modulator is configured to change the phase select control signal and the programmable integer divider in response to changes of the reference frequency.

12. The apparatus of claim 10, further comprising a phase detector configured to change the controllable frequency of the multi-phase oscillator based on the reference frequency and the synchronized output.

13. The apparatus of claim 10, wherein the synchronizer comprises a flip-flop including a data input electrically connected to the divider output, a clock input electrically connected to the selected phase signal, and a data output configured to generate the synchronized output.

14. The apparatus of claim 9, wherein the multi-phase oscillator comprises a rotary travelling wave oscillator (RTWO).

15. The apparatus of claim 9, wherein the phase selector comprises a multiplexer.

16. The apparatus of claim 9, wherein the delta-sigma modulator is configured to repeatedly change the programmable integer divisor back and forth between a value of N and a value of N+1.

17. The apparatus of claim 9, wherein the delta-sigma modulator has an order greater than 2.

18. The apparatus of claim 17, wherein delta-sigma modulator is further configured to generate the phase select control signal to reduce the phase noise by about $20 \cdot \log_{10}(2^O)$, wherein O is the order of the delta-sigma modulator.

19. An apparatus comprising:
means for oscillating generating a plurality of phase signals oscillating at a controllable frequency;
means for selecting a phase signal of the plurality of phase signals to generate a selected phase signal;
a divider configured to divide the selected phase signal by a programmable integer divisor to generate a divider output; and
a delta-sigma modulator configured to which of the plurality of phase signals is selected as the selected phase signal and to regularly change the programmable integer divisor to synthesize a fractional divide ratio.

20. The apparatus of claim 19, wherein the delta-sigma modulator is further configured to generate the phase select control signal so as to reduce a phase noise associated with changes of the programmable integer divisor.

* * * * *